(12) United States Patent
Canet et al.

(10) Patent No.: US 12,046,892 B2
(45) Date of Patent: Jul. 23, 2024

(54) ELECTRONIC INSTALLATION DEVICE

(71) Applicant: Schneider Electric Industries SAS, Rueil-Malmaison (FR)

(72) Inventors: Thomas Canet, Marienheide (DE); Christian Kneifel, Neunkirchen (DE); May Zhang, Shenzhen (CN); Linda Hao, Shenzhen (CN)

(73) Assignee: Schneider Electric Industries SAS, Rueil-Malmaison (FR)

( * ) Notice: Subject to any disclaimer, the term of this patent is extended or adjusted under 35 U.S.C. 154(b) by 331 days.

(21) Appl. No.: 17/619,981

(22) PCT Filed: Jun. 12, 2020

(86) PCT No.: PCT/EP2020/066404
§ 371 (c)(1),
(2) Date: Dec. 16, 2021

(87) PCT Pub. No.: WO2020/254213
PCT Pub. Date: Dec. 24, 2020

(65) Prior Publication Data
US 2022/0360069 A1  Nov. 10, 2022

(30) Foreign Application Priority Data

Jun. 21, 2019 (DE) .................. 10 2019 116 789.2

(51) Int. Cl.
*H02H 3/10* (2006.01)
*H02H 3/08* (2006.01)
*H05K 1/02* (2006.01)

(52) U.S. Cl.
CPC .............. *H02H 3/10* (2013.01); *H02H 3/085* (2013.01); *H05K 1/0298* (2013.01)

(58) Field of Classification Search
CPC .......... H02H 3/10; H02H 3/085; H05K 1/0298
See application file for complete search history.

(56) References Cited

U.S. PATENT DOCUMENTS

| 6,738,246 B1 | 5/2004 | Strümpler | |
| 2004/0246661 A1* | 12/2004 | Busch | H01H 89/06 361/605 |

(Continued)

FOREIGN PATENT DOCUMENTS

| DE | 199 27 762 A1 | 1/2001 |
| DE | 101 19 458 A1 | 11/2002 |

(Continued)

OTHER PUBLICATIONS

International Search Report and Written Opinion issued Aug. 4, 2020 in PCT/EP2020/066404, 12 pages.

(Continued)

*Primary Examiner* — Jue Zhang
*Assistant Examiner* — Lakaisha Jackson
(74) *Attorney, Agent, or Firm* — Oblon, McClelland, Maier & Neustadt, L.L.P.

(57) ABSTRACT

An electronic installation device for controlling a load in an electrical circuit, which comprises a single or multi-layer printed circuit board arrangement with electrical components and conductor tracks and which comprises a load circuit and a control circuit. According to the invention, in order to provide an electronic installation device with protective devices against short-circuit and against overload and which are specific to devices, the load circuit and the control circuit are at least functionally coupled to one another, and the electronic installation device comprises a first overcurrent protection device for protection against short-circuit currents and a second overcurrent protection device for protection against overload currents.

20 Claims, 4 Drawing Sheets

(56) References Cited

U.S. PATENT DOCUMENTS

Figure 1:
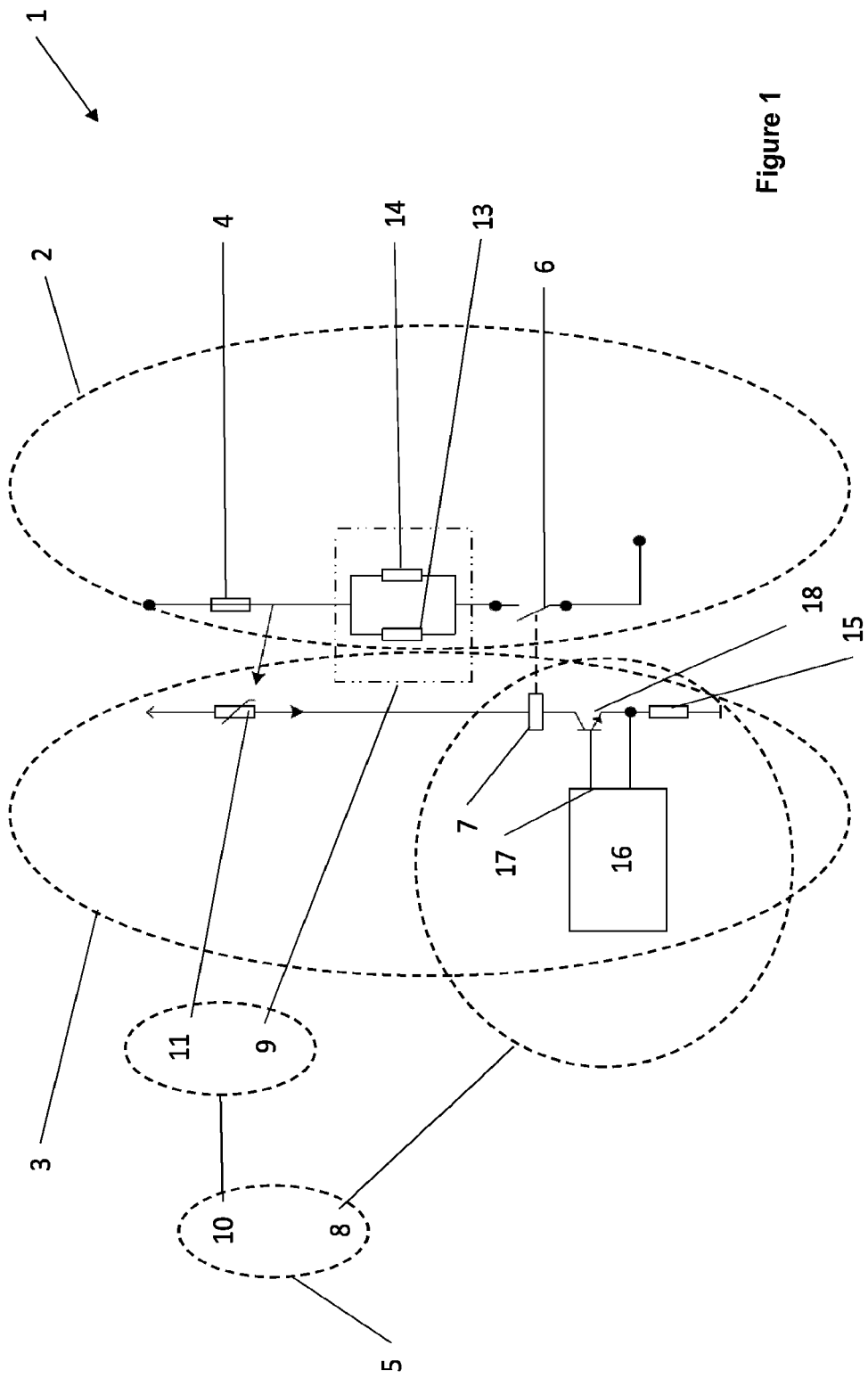

2017/0338645 A1* 11/2017 Wang ................ H01H 85/0241
2017/0345600 A1   11/2017 Naumann et al.

FOREIGN PATENT DOCUMENTS

| DE | 10 2006 059 384 A1 | 6/2008 |
| DE | 20 2015 106 694 U1 | 6/2016 |
| DE | 10 2017 110 897 A1 | 11/2017 |
| EP | 0 037 490 A1 | 10/1981 |
| EP | 0 519 346 A1 | 12/1992 |
| RU | 2321164 C1 | 3/2008 |
| SU | 1304127 A1 | 4/1987 |

OTHER PUBLICATIONS

German Search Report issued Mar. 20, 2020 in German Patent Application No. 10 2019 116 789.2, 6 pages.
Russian Search Report issued Oct. 18, 2023, in corresponding Russian Patent Application No. 2022101218/07(002400) (with English Translation of Category of Cited Documents), 3 pages.

* cited by examiner

ELECTRONIC INSTALLATION DEVICE

The invention relates to an electronic installation device in accordance with the preamble of claim 1.

Such electronic installation devices can include switching contacts, e.g. of a relay, or power semiconductor devices for load current guidance and electronic control devices for controlling a relay coil or for controlling power semiconductor devices.

Such electronic installation devices are often used in electrical installation systems of building services technology and are designed for a load current that is significantly below the rated current, e.g. 16 amperes, of the circuits typical in building installation. For example, blind switches, timers, etc. are designed for a load current in ranges between 3 amperes and 8 amperes.

The electronic installation devices have to be tested with the tripping current of a fuse element connected upstream, preferably a circuit breaker, of the building installation when tested in accordance with the standards. Due to the difference between the load current of an electronic installation device and the tripping current of the building-side fuse element connected upstream, the electronic installation device would be insufficiently fused, namely too high. In the event of an overcurrent in the range between the rated device current and the tripping current of the fuse element of the building installation connected upstream, the electronic installation device would be unprotected and could be destroyed.

Under safety-technical aspects, the arrangement of a device-specific fuse is necessary in such cases to protect against overcurrent. It is known to use fast-responding lead fuses, which are preferably arranged in the load circuit, as device-specific fuses in electronic systems having a load circuit and a control circuit. Electronic systems are reliably protected against a short-circuit current in the load circuit by such an overcurrent protection device.

If a current flows in the load circuit that is less than the short-circuit current, but greater than the rated device current, electrical components can still be damaged. In general, this so-called overload is defined as an exceeding of the admissible current in the electrically undamaged circuit. In this respect, the heat development caused by the current destroys electrical conductors and components by exceeding admissible limit temperatures. An overload protection device detects the heating of conductors and/or components and switches off the circuit at least temporarily.

Short-circuit currents and overload currents result in different technical requirements for protection devices. Current-conducting lines heat up to inadmissibly high temperatures in the event of both short circuits and overloads. The essential difference is that in the case of a short circuit with high short-circuit currents, the inadmissibly high amount of heat can already be reached in fractions of an electrical half-oscillation. Lead fuses also melt within a sufficiently short time with high short-circuit currents. In the event of an overload, currents occur that are only slightly above the maximum permanently admissible load capacity of a line and only heat up the line to inadmissibly high temperatures after a longer time. In a circuit loaded in this way, a fuse, preferably a reversible fuse, can ensure that the inadmissibly high temperature cannot be reached at the conductors and components and that protection exists in the event of an overload.

With a single device-internal pre-fuse, both the short-circuit case and the overload case can be fuse-protected. In this respect, the rating of the lead fuse is, however, based on the lower value for the overload case. This results in the fuse tripping more often than necessary. It is disadvantageous that such lead fuses are destroyed after tripping and thus have to be replaced in order to restore the functionality of the device after the overload situation has been eliminated.

Known device circuit breakers or miniature circuit breakers, which both specifically fuse-protect overcurrent cases, cannot be used with electronic devices that are implemented in small parts and mainly on conductor tracks due to their size and structure. Thermal protection devices having mechanical components can likewise not be used as overload protection due to their size.

Furthermore, self-resetting fuses are known, for example electrical components having PTC (positive temperature coefficient) characteristics that comprise a polymer-based positive temperature coefficient thermistor having a non-linear resistance curve. This positive temperature coefficient thermistor is low-impedance at normal temperature. If the positive temperature coefficient thermistor heats up, for example due to an external heat supply, it becomes high-impedance, whereby the current flow is greatly limited. If the heat supply is reduced, the positive temperature coefficient thermistor cools down and becomes low-impedance again.

Electronic installation devices are predominantly implemented in small parts on conductor track packages. An implementation of a complete overcurrent protection based on conductor track structures is not known so far since in particular the usual conductor track geometry having small layer thicknesses and large surfaces is not suitable for the loading with different current limit values. The short-circuit protection with a lead fuse requires a higher melting integral at all other points of the conductor track structure and consequently large conductor track surfaces. In contrast, the heat generation and dissipation of a conductor required for an overload protection by means of PTC elements cannot be implemented with the usual conductor track width. However, a required tapered conductor track would be destroyed in the event of a short circuit.

An implementation of a PTC-based overload protection would have the result that no separate short-circuit protection would be possible on the conductor track package. The corresponding fuse of the house installation, usually a reversible automatic circuit breaker, would have to be replaced in accordance with the lower rated current of the installation device.

A solution that specifically and optimally protects electronic installation devices against both overcurrent scenarios is not known.

The object of the present invention is therefore to eliminate the above-mentioned disadvantages and to implement an electronic installation device having device-specific protection devices against short circuits and against overloads.

This object is satisfied by the features set forth in claim 1. Advantageous embodiments result from the dependent claims.

The invention in accordance with claim 1 has the advantage that the electronic installation device in accordance with the invention is protected against overcurrent by a combination of two specific protection devices coordinated with one another. A first overcurrent protection device protects against a short circuit, while a second overcurrent protection device fuse-protects the overload case.

The electronic installation device can preferably be connected in series with a load. From a technical circuit aspect, the electronic installation device can comprise a load circuit and a control circuit that are thermally and physically/ electrically coupled. The load circuit can have a first overcurrent protection device, a resistor element, and a circuit interruption element that can be arranged in series between a current source and an electrical load.

An overcurrent detection device can cooperate with a control device as a second overcurrent protection device. The control device can be arranged in the control circuit and can be functionally connected to the circuit interruption element in the load circuit. The overcurrent detection device can comprise a sensor element in the control circuit, preferably a reversible electrical component, for example in the form of a positive temperature coefficient (PTC) thermistor, and a resistor element in the load circuit that is thermally coupled to the PTC element. The resistor element extends as a conductor track galvanically separated beneath the PTC element.

The electronic installation device can at least partly be implemented on a circuit board arrangement and can, in the load circuit, have the first overcurrent protection device in the form of a lead fuse that protects the device-specific electrical components and conductors in the event of a short circuit. This means that the melting integral of the protected components and conductor tracks is higher than the melting integral of the fuse. The fuse is only designed for the short-circuit case and not for the overload case.

The resistor element in the form of a conductor track of the load circuit is specifically adapted, on the one hand, not to be destroyed in the event of a short circuit and, on the other hand, to enable the detection of the thermal energy in the event of an overload. At this point, the conductor track can comprise two conductor tracks of different widths connected in parallel. In this respect, the width ratio is preferably 5 to 1. The wide conductor track absorbs the short-circuit current, while the narrow conductor track serves to detect the overload state. In this respect, the common melting integral of both conductor tracks is higher than the melting integral of the lead fuse.

Under normal operating conditions, the electronic installation device is in a state having a low temperature and a low resistance. In the event of a short circuit, the current increases very quickly and causes the fuse element in the first overcurrent protection device to melt, whereby the current flow through the fuse is permanently interrupted. Since the common melting integral of the two conductor tracks of the resistor element is higher, no damage occurs at this point. The narrow conductor track is not destroyed in this respect since the current uses the path of least resistance via the sufficiently dimensioned wide conductor track on a high current flow in the event of a short circuit. The lead fuse does not trip in the event of an overload in the range between the short-circuit current (tripping current of the lead fuse) and the rated current of the installation device.

In the case of an overload, the current through the resistor element increases comparatively slowly, wherein in particular the environmental temperature of the narrow conductor track increases excessively and is maintained longer than the normal operating time. The sensor element is "triggered" by the environmental temperature of the conductor track, i.e. converted into a state having a high temperature and a high resistance so that the current is substantially reduced. The change in the resistance and current values is "communicated" to the control device and therein causes the circuit interruption element, e.g. a relay or a power semiconductor device, in the load circuit to change from a normal operating state to a triggered state and thus the disconnection of the load also takes place.

In the control circuit, the sensor element can form a voltage divider with a resistor, with the changing voltage of the voltage divider being read into a microcontroller and processed. When an overload is recognized, the relay or power semiconductor device connected to the microcontroller, and thus also the load in the load circuit, is disconnected. Alternatively, it is also possible to disconnect without a microcontroller in the event of an overload. If the overload current in the load circuit increases further, the narrow conductor track of the resistance element heats up further until the decreasing control current of the sensor element falls below the holding current of the relay. The relay falls off and opens the load circuit. The sensor element remains in the triggered state until the temperature returns to normal and was able to cool down. The return to the normal state then follows, i.e. the repeat connection of the load. The sensor element is not arranged in series with the load and can therefore operate at current levels that are much lower than the normal circuit that flows through the load.

The determination of the width of the two conductor tracks of the resistor element takes place in accordance with the following rules. For the short-circuit consideration, the energy that is absorbed in the form of the melting integral is relevant. The melting integral of the conductor tracks of the installation device has to be higher than the melting integral of the fuse. The common melting integral of the two conductor tracks of the resistor element also has to be designed in accordance with this specification. The ratio of the melting integrals of the conductor tracks to one another is preferably in a ratio greater than 25.

Due to these specifications, the diameter of the round conductor can be determined by converting the melting integral of the lead fuse related to a round conductor. The resulting cross-section can be converted to the minimum width of the two conductor tracks. When a ratio of 25 to 1 for the melting integrals of the two conductor tracks is assumed, a ratio of the width of the conductor tracks of 5 to 1 results. In this respect, it is assumed that the two conductor tracks consist of the same material and have the same thickness.

The electronic installation device in accordance with the invention can at least partly comprise a layer-wise or package-wise arrangement of circuit boards that comprise one or more substrate layers on each of which electrical components and/or conductor tracks are arranged at one or both sides. The two overcurrent protection devices are advantageously formed at the two outer main surfaces of the circuit board arrangement. The first overcurrent protection device, in the form of a lead fuse, can be arranged on a lower substrate layer and at least the sensor element of the second overcurrent protection device, in the form of a PTC element, can be arranged on an upper substrate layer. The conductor tracks of the resistor element connected in parallel are arranged beneath the sensor element. The correspondingly structured resistor element can advantageously comprise a wide conductor track and a tapered conductor track and can be arranged in different substrate layers of the circuit board structure. The narrow conductor track can in particular be arranged near the surface or on the surface of the outer layer to enable the use of a sensor element on the surface (SMD technique) of the circuit board arrangement. The tapered conductor track can have a reduced width or a thinned height dimension. In addition to the circuit-relevant functions, the various layers of the circuit board structure serve to maximize the area of the conductor tracks in order to withstand a short-circuit current. FR4 with a common height is used as the standard dielectric. Suitable sensor elements comprise a PTC-conductive polymer, i.e. a composition comprising an organic polymer and a particulate conductive filler and/or a conductive inorganic filler.

Electronic installation devices in accordance with the invention are often used to protect circuit arrangements having device-specific relatively high current loads and relatively low voltage loads such as blind switches, timers, or fans. Such circuits typically include electrical loads that cause overcurrents on the tripping of the load, e.g. a motor, or under more difficult operating conditions. One advantage of the electronic installation switch with the integrated overcurrent protection devices is that it can be safely used in already present circuits that are too highly fuse-protected per se. With the arrangement in accordance with the invention, a specific (higher) device-internal short-circuit fuse can be used that neither requires a replacement of the usual automatic circuit breaker of the house installation nor has a (lower) value (e.g. 10 amperes instead of 8 amperes) oriented to the overload current in order to minimize the temperature effect. An inadmissibly strong heating of the electronic installation device can be prevented since the fuse is only used for short circuits and not for overload. Consequently, a typical fuse size (16 amperes) can be used at the house installation side. The short-circuit case is protected separately in the installation device by the first overcurrent protection device in the form of a lead fuse. The overload case is protected by the second overcurrent protection device and not by a lead fuse. A robust circuit is produced that can also be used with increased specifications for a motor load (e.g. under abnormal conditions the device can handle 8 A without particular anomalies).

The basic structure of a circuit board arrangement can remain unchanged. Material and material thicknesses of substrates, insulation layers, and conductor tracks remain the same. The conductor track cross-section can be further implemented with an optimized width-to-thickness ratio so that a compact and cost-effective production with small product dimensions can take place in a small space. The use of and population with electronic components can likewise be maintained. The principles of the present invention can be used in larger circuit board arrangements and subassemblies that have printed circuit tracks and components.

Further details, features, and advantages of the invention result from the following description of a preferred embodiment example with reference to the drawings.

Figure 2:
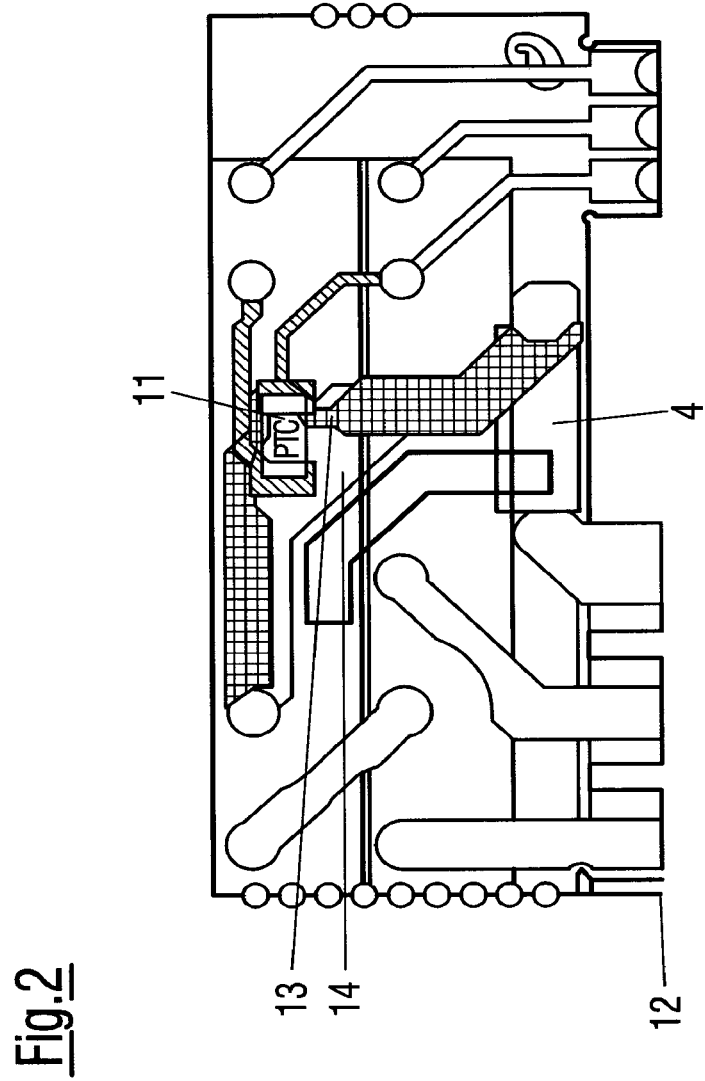
Figure 3:
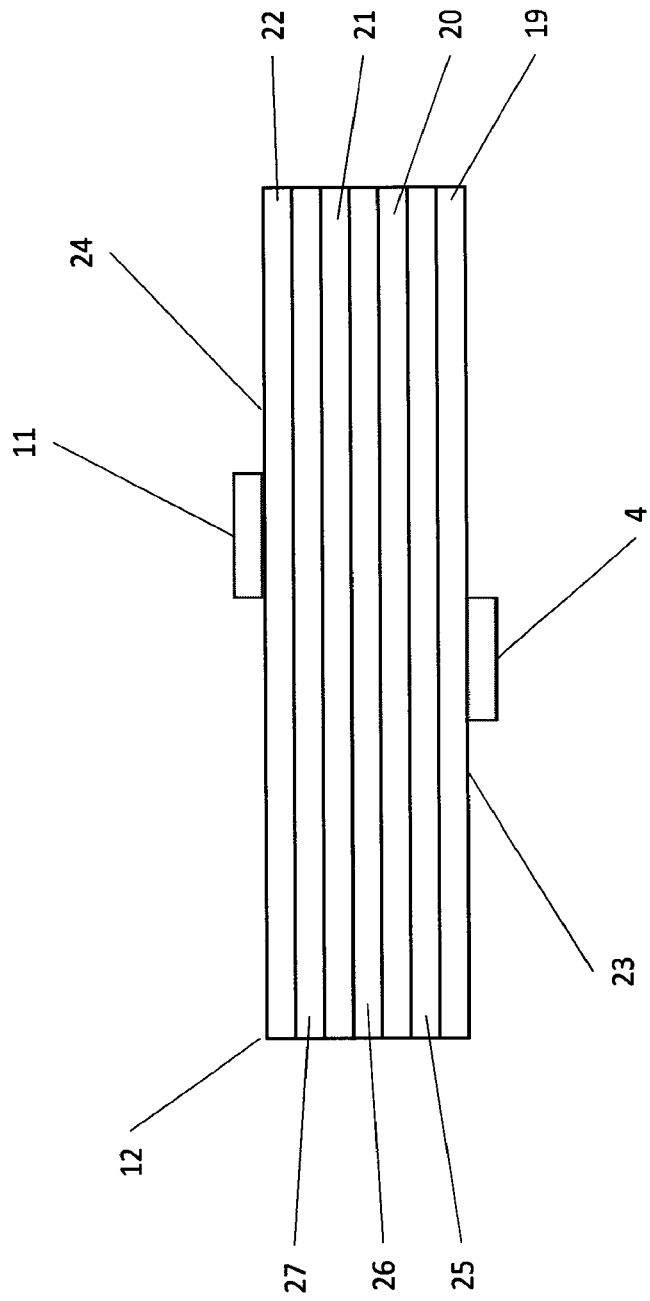
Figure 4B:
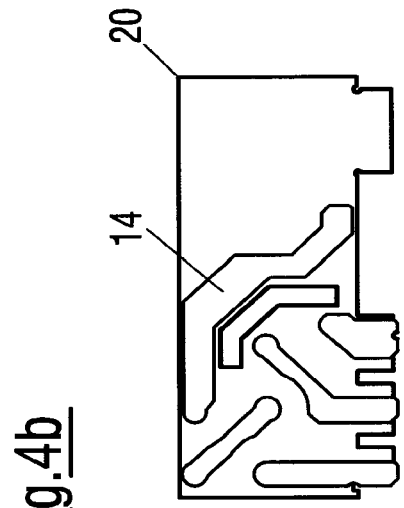
Figure 4D:
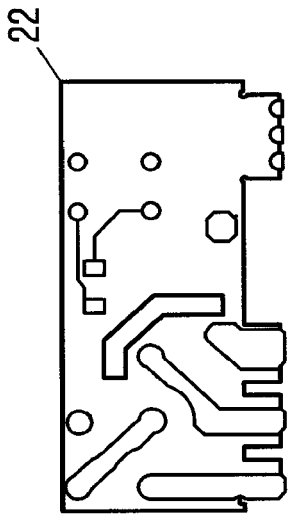
Figure 4A:
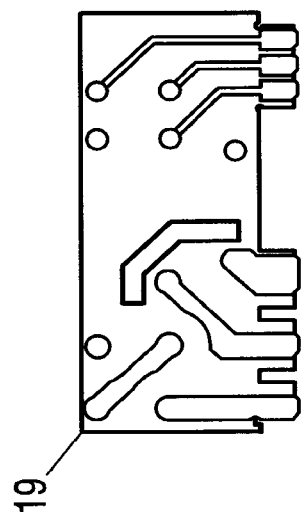
Figure 4C:
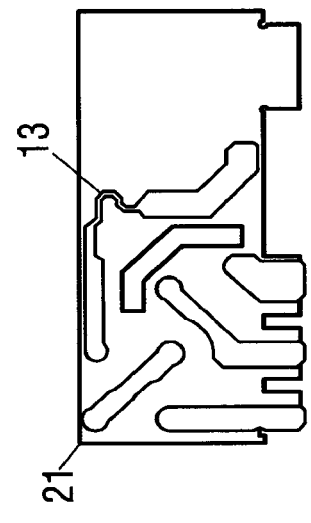

There are shown:

FIG. 1 a circuit arrangement of an electronic installation device;

FIG. 2 a schematic circuit board arrangement in a plan view;

FIG. 3 a sketched circuit board arrangement in cross-section; and

FIG. 4*a-d* different layers of the circuit board arrangement in accordance with FIG. 2 and FIG. 3.

Components which are the same or which have the same effect are provided with the same reference numerals in the following description.

FIG. 1 shows a fundamental circuit arrangement for an electronic installation device 1. The electronic installation device 1 can preferably be connected in series with a load (not shown). From a technical circuit aspect, the electronic installation device 1 comprises a load circuit 2 and a control circuit 3 that are thermally, physically, and/or electrically coupled. The electronic installation device 1 is protected against overcurrent by a combination of two specific protection devices coordinated with one another. A first overcurrent protection device 4 protects against a short circuit, while a second overcurrent protection device 5 fuse-protects the overload case.

The electronic installation device 1 includes a circuit interruption element 6 in the form of a switching contact of a relay 7 by which the electrical connection of the load to a voltage supply can be switched on and off. The control of the relay 7 takes place by a control device 8 in the control circuit 3 that supplies switching commands to a coil of the relay 7.

The load circuit 2 has a first overcurrent protection device 4, a resistor element 9, and the circuit interruption element 6 that are arranged in series between a power source (not shown) and an electrical load. An overcurrent detection device 10 cooperates together with the control device 8 as a second overcurrent protection device 5. The control device 8 is arranged in the control circuit 3 and is functionally connected to the circuit interruption element 6 in the load circuit 2. The overcurrent detection device 10 comprises a sensor element 11 in the control circuit 3, preferably a reversible electrical component in the form of a positive temperature coefficient (PTC) thermistor, and the resistor element 9 in the load circuit 2 that is thermally coupled to the PTC element 11. The resistor element 9 extends as a conductor track galvanically separated beneath the PTC element 11.

The electronic installation device 1 is at least partly implemented on a circuit board structure 12 and has, in the load circuit 2, the first overcurrent protection device 4 in the form of a lead fuse that protects the device-specific electrical components and conductors in the event of a short circuit. This means that the melting integral of the protected components and conductor tracks is higher than the melting integral of the fuse 4. The fuse 4 is designed for short circuit only and not for overload. The certified fuse 4 used is adapted to minimize temperature effects and to process a tripping current. In the event of a short circuit, the load circuit 2 is permanently interrupted by the fuse 4.

The resistor element 9 in the form of a conductor track of the load circuit is specifically adapted to not to be destroyed in the event of a short circuit, on the one hand, and to enable the detection of the thermal energy in the event of an overload, on the other hand. At this point, the conductor track comprises two conductor tracks 13 and 14 of different widths connected in parallel. In this respect, the width ratio is preferably 5 to 1. The wide conductor track 14 absorbs the short-circuit current, while the narrow conductor track 13 serves to detect the overload current. In this respect, the common melting integral of both conductor tracks 13 and 14 is higher than the melting integral of the lead fuse 4.

With reference to FIG. 1, the operation of the electronic installation device 1 in accordance with the invention will be described in the following. In this respect, the electrical network of a house installation can provide the operating current for the electronic installation device 1. When the circuit interruption element 6 of the relay 7 is closed in the load control circuit 2, the operating current flows to the load, for example, a brush motor having relatively high current for a blind control. A control current source, which is separate from the primary current source, provides control current for the control circuit 3. The control current flows to a coil of the relay 7 via the sensor element 11 and normally causes a closing of the circuit interruption element 6, whereby the load circuit 2 is closed. Under normal operating conditions, the electronic installation device 1 is in a state having a low temperature and a low resistance.

A fault current is a current level that damages one of the components of an electrical circuit. In the event of a short circuit, the current increases very rapidly and causes the fuse element in the first overcurrent protection device 4 to melt, whereby the current flow is permanently interrupted. Since the common melting integral of the two conductor tracks 13 and 14 of the resistor element 9 is higher, no damage occurs at this point. The narrow conductor track 13 is not destroyed in this respect since the current uses the path of least resistance via the sufficiently dimensioned wide conductor track 14 on a high current flow in the event of a short circuit. The lead fuse 4 does not trip in the event of an overload in the range between the short-circuit current (tripping current of the lead fuse) and the rated current of the electronic installation device 1.

In the case of an overload when the rated device current is exceeded, for example, the motor stalls, the current through the resistor element 9 increases rapidly but comparatively slightly, wherein in particular the environmental temperature of the narrow conductor track 13 increases excessively and is maintained longer than the normal operating time. The PTC element 11 is "triggered" by the environmental temperature of the narrow conductor track 13, i.e. is converted into a state having a high temperature and a high resistance so that the current is substantially reduced. The change in the resistance and current values is "communicated" to the control device 8. In the control circuit 3, the PTC element 11 forms a voltage divider with a resistor 15, with the changing voltage of the voltage divider being read into a microcontroller 16 and processed. When an overload is recognized, it is brought about that the relay 7 connected to an output 17 of the microcontroller 16 via a transistor 18 is disconnected and the corresponding functionally coupled circuit interruption element 6 opens and a disconnection of the load thus also takes place. Different operating modes can be set at the microcontroller 16. Thus, it can, for example, be defined whether the load is to be automatically connected again after some time, or only after a repeat switch-on command, or after a reset of the interruption of the load circuit 2. The trigger characteristic is also selectable.

Alternatively, it is also possible to disconnect without a microcontroller 16 in the event of an overload. If the overload current in the load circuit 2 increases further, the conductor track 13 and the sensor element 11 heat up further until the decreasing current in the control circuit 3 falls below the holding current of the relay 7. The relay coil falls off and opens the load circuit 2 via the circuit interruption element 6. The PTC element 11 remains in the triggered state until the temperature is normal again and can cool down. The return to the normal state then follows, i.e. the repeat connection of the load. The PTC element 11 is not arranged in series with the load and can therefore operate at current levels that are much lower than the normal circuit that flows through the load.

With reference to FIGS. 2 to 4, a possible circuit board structure 12 of the electronic installation device 1 is shown that comprises one or more substrate layers 19 to 22 that have a dielectric core layer having electrical components and/or conductor tracks that are each arranged at one or both sides. The two overcurrent protection devices 4 and 5 are at least partly formed at the two outer main surfaces 23 and 24 of the circuit board structure 12. The first overcurrent protection device, in the form of a lead fuse 4, is arranged on the lower substrate layer 19 and at least the sensor element 11 of the second overcurrent protection device 5, in the form of a PTC element, is arranged on the upper substrate layer 22. The conductor tracks 13 and 14 of the resistor element 9 that are electrically connected in parallel are arranged beneath the PTC element. The correspondingly structured conductor track is arranged in different substrate layers of the circuit board structure 12. The tapered conductor track 13 is arranged in the substrate layer 20, while the wide conductor track 14 is arranged in the substrate layer 21. The two conductor tracks 13 and 14 are directly connected by conductive vias. The narrow conductor track 13 is in particular arranged close to the surface in the layer 20 to enable the use of a PTC element 11 on the surface (SMD technique). The PTC element 11 on the substrate layer 19 is in thermal contact with the substrate layer 20 directly above the surface of the tapered conductor track 13 so that heat is generated there as a result of an overcurrent state and is effectively transmitted to the PTC element 11 so that a control signal is generated as previously explained.

Ideally, the layers of the circuit board arrangement 12 are as thin as is structurally practical. The dielectric material that forms the substrate can be a thin polyester material or another suitable thin flexible substrate. A thin but relatively rigid substrate of glass fiber reinforced resin can likewise be used. The structuring of the copper layers can be performed by conventional photoresist and chemical etching techniques that are known to the skilled person. In addition to the circuit-relevant functions, the various layers of the circuit board arrangement serve to maximize the area of the conductor tracks to be able to withstand a short-circuit current. For the insulation between the substrate layers of the circuit board arrangement, layers 25 to 27 of FR4 having a common height are used as the standard dielectric. Suitable PTC elements 11 comprise a PTC-conductive polymer, i.e. a composition comprising an organic polymer and a particulate conductive filler and/or a conductive inorganic filler.

The above description of the embodiment example serves only for illustrative purposes and not for the purpose of restricting the invention. Various changes and modifications are possible within the framework of the invention without leaving the scope of the invention or its equivalents.

REFERENCE NUMERAL LIST 1 electronic installation device
2 load circuit
3 control circuit
4 first overcurrent protection device
5 second overcurrent protection device
6 circuit interruption element
7 relay
8 control device
9 resistor element
10 overcurrent detection device
11 sensor element
12 circuit board arrangement
13 narrow conductor track
14 wide conductor track
15 resistor
16 microcontroller
17 output
18 transistor
19 substrate layer
20 substrate layer
21 substrate layer
22 substrate layer
23 surface of the substrate layer 19
24 surface of the substrate layer 22
25 insulation layer
26 insulation layer
27 insulation layer

The invention claimed is:

1. An electronic installation device for controlling a load in an electric circuit, said electronic installation device having a single-layer or multilayer circuit board arrangement having electrical components and conductor tracks and said electronic installation device comprising a load circuit and a control circuit that are at least functionally coupled to one another, wherein the electronic installation device has a first overcurrent protection device for protection against short-circuit currents and a second overcurrent protection device for protection against overload currents.

2. An electronic installation device in accordance with claim 1, wherein the load circuit comprises a first overcurrent protection device, a resistor element, and a circuit interruption element that can be arranged in series between a current source and an electrical load.

3. An electronic installation device in accordance with claim 2, wherein the control circuit has a second overcurrent protection device that has an overcurrent detection device and a control device that is functionally connected to the circuit interruption element.

4. An electronic installation device in accordance with claim 3, wherein the overcurrent detection device comprises a reversible sensor element in the control circuit and the resistor element in the load circuit, with the sensor element being thermally coupled to the resistor element.

5. An electronic installation device in accordance with claim 4, wherein the sensor element is a positive temperature coefficient thermistor.

6. An electronic installation device in accordance with claim 3, wherein the resistor element is arranged as a conductor track galvanically separated beneath the sensor element.

7. An electronic installation device in accordance with claim 3, wherein the resistor element comprises two conductor tracks of different widths and/or thicknesses connected in parallel.

8. An electronic installation device in accordance with claim 7, wherein the width ratio between the two conductor tracks is 5 to 1 with the same thickness and with the same material.

9. An electronic installation device in accordance with claim 7, wherein the narrow conductor track comprises a section narrowed in the width or a section thinned in the height.

10. An electronic installation device in accordance with claim 7, wherein the wide conductor track absorbs the short-circuit current, while a narrow conductor track serves to detect the overload current.

11. An electronic installation device in accordance with claim 7, wherein the two conductor tracks of the resistor element are arranged in different layers of the circuit board arrangement.

12. An electronic installation device in accordance with claim 7, wherein a narrow conductor track is arranged close to the surface or on the surface of the outer layer, with the sensor element being arranged in a thermally contacted and electrically insulated manner with respect to the conductor track.

13. An electronic installation device in accordance with claim 2, wherein the circuit interruption element is functionally connected to a relay or to power semiconductor devices.

14. An electronic installation device in accordance with claim 1, wherein the first overcurrent protection device (4) is irreversible.

15. An electronic installation device in accordance with claim 1, wherein a melting integral of the protected components and conductor tracks is higher than a melting integral of the fuse of the first overcurrent protection device.

16. An electronic installation device in accordance with claim 1, wherein a common melting integral of the two conductor tracks of the resistor element is higher than the melting integral of the first overcurrent protection device and the ratio of a melting integrals of the conductor tracks to one another is in a ratio greater than 25.

17. An electronic installation device in accordance with claim 1, wherein the first overcurrent protection device, on the one hand, and at least one sensor element of the second overcurrent protection device, on the other hand, are arranged on the two outer main surfaces of the circuit board arrangement.

18. An electronic installation device in accordance with claim 1, wherein the circuit board arrangement comprises one or more layers on each of which electrical components and/or conductor tracks are arranged at one or both sides.

19. An electronic installation device in accordance with claim 1, wherein the layer(s) is/are at least partly flexible and/or inflexible.

20. An electronic installation device in accordance with claim 1, wherein the overload current generates a heating in a narrow conductor track of a resistor element, which heating causes a reaction of a control device, and thus a temporary interruption of the load circuit, due to the thermal coupling with a sensor element.

* * * * *